(12) United States Patent
Aoki et al.

(10) Patent No.: US 6,746,714 B2
(45) Date of Patent: Jun. 8, 2004

(54) POROUS SILICA COATING WITH LOW DIELECTRIC CONSTANT, SEMICONDUCTOR DEVICE AND COATING COMPOSITION

(75) Inventors: Tomoko Aoki, Kakegawa (JP); Yasuo Shimizu, Saitama (JP)

(73) Assignee: Clariant Finance (BVI) Limited (VG)

( * ) Notice: Subject to any disclaimer, the term of this patent is extended or adjusted under 35 U.S.C. 154(b) by 57 days.

(21) Appl. No.: 10/370,588

(22) Filed: Feb. 24, 2003

(65) Prior Publication Data

US 2003/0152783 A1 Aug. 14, 2003

Related U.S. Application Data

(62) Division of application No. 10/009,735, filed as application No. PCT/JP00/04021 on Jun. 20, 2000, now abandoned.

(30) Foreign Application Priority Data

Jul. 13, 1999 (JP) .......................................... 11-199282

(51) Int. Cl.[7] .................................................. B05D 3/02
(52) U.S. Cl. .................... 427/226; 427/126.2; 427/373; 427/397.7
(58) Field of Search ................................. 427/226, 331, 427/372.2, 384, 385.5, 387, 397.7, 126.2, 373

(56) References Cited

U.S. PATENT DOCUMENTS

| | | | |
|---|---|---|---|
| 6,042,994 A | 3/2000 | Yang et al. | |
| 6,090,724 A | 7/2000 | Shelton et al. | |
| 6,204,202 B1 | 3/2001 | Leung et al. | |
| 6,329,017 B1 | 12/2001 | Liu et al. | |
| 6,395,651 B1 | 5/2002 | Smith et al. | |
| 6,413,882 B1 * | 7/2002 | Leung et al. | 438/781 |
| 2002/0034626 A1 * | 3/2002 | Liu et al. | 428/312.6 |

FOREIGN PATENT DOCUMENTS

| | | |
|---|---|---|
| EP | 0 332 357 | 9/1989 |
| EP | 0 344 870 | 12/1989 |
| JP | 7-292321 | 11/1995 |
| JP | 9-183949 | 7/1997 |
| JP | 10-218690 | 8/1998 |
| JP | 11-105185 | 4/1999 |
| JP | 11-105186 | 4/1999 |
| JP | 11-105187 | 4/1999 |

* cited by examiner

*Primary Examiner*—Stephen Stein
(74) *Attorney, Agent, or Firm*—Alan P. Kass

(57) ABSTRACT

A coating composition having an aluminum-containing polysilazane and a polyacrylate or polymethacrylate ester in an organic solvent and methods of producing the same.

8 Claims, No Drawings

POROUS SILICA COATING WITH LOW DIELECTRIC CONSTANT, SEMICONDUCTOR DEVICE AND COATING COMPOSITION

CROSS-REFERENCE TO RELATED APPLICATIONS

This application is a divisional application of U.S. patent application Ser. No. 10/009,735, filed Dec. 17, 2001, now abandoned, which application is the national phase filing under 35 U.S.C. §371, of international application number PCT/JP00/04021, filed Jun. 20, 2000, published in a non-English language, the disclosures of which are incorporated herein in their entireties.

TECHNICAL FIELD

The present invention relates to a porous silica coating with a low dielectric constant, a semiconductor device comprising the porous silica coating, and a coating composition which becomes the porous silica coating.

BACKGROUND ART

Polysilazane coatings are converted into silica coatings by firing in atmospheric air. These silica coatings are used as interlayer dielectrics for semiconductors because of excellent electrical insulating properties. Among these silica coatings, a completely inorganic silica coating has already been employed as an excellent interlayer dielectric for a semiconductor because it has high heat resistance and can be used in a non-etch back process. In this case, the physical properties of the silica coating are similar to those of silicon dioxide ($SiO_2$) and its dielectric constant is within a range from 3.0 to 4.7.

With the increase of the speed and integration density of integrated circuits, a further reduction in dielectric constant is required of electronic materials such as interlayer dielectrics. However, the dielectric constant of a conventional silica coating is too high for such a requirement. It is known to make the silica coating porous so as to reduce the dielectric constant, however, the silica coating generally has moisture absorption properties and the dielectric constant increases with the elapse of time, under an ambient atmosphere. It has been proposed that a porous coating is subjected to a water repellent treatment thereby to add an organic group such as a trimethylsilyl group to the surface in order to prevent an increase in dielectric constant with the elapse of time due to moisture absorption. However, such an additional water repellent treatment causes the problem that the manufacturing cost increases and introduction of the organic group impairs an inorganic material's ability to make it possible to be used in a non-etch back process.

Thus, an object of the present invention to provide a silica coating which makes it possible to drastically reduce the dielectric constant (especially to less than 2.5) and to substantially maintain the reduced dielectric constant under an ambient atmosphere without being subjected to a water repellent treatment. Another object of the present invention is to provide a semiconductor device comprising the silica coating with such a low dielectric constant as an interlayer dielectric, and a coating composition which becomes the silica coating.

DISCLOSURE OF THE INVENTION

In order to achieve the objects described above, the present inventors have intensively studied and thus completed the present invention.

According to the present invention, there is provided a porous silica coating having a dielectric constant of less than 2.5, which is obtained by firing a coating of a composition comprising an aluminum-containing polysilazane and a polyacrylate or polymethacrylate ester.

According to the present invention, there is also provided a semiconductor device comprising the porous silica coating as an interlayer dielectric.

According to the present invention, there is also provided a coating composition comprising an aluminum-containing polysilazane and a polyacrylate or polymethacrylate ester in an organic solvent.

MODE FOR CARRYING OUT THE INVENTION

The porous silica coating of the present invention is obtained by firing a coating of a composition comprising an aluminum-containing polysilazane and a polyacrylate or polymethacrylate ester. The aluminum-containing polysilazane is obtained by mixing a polysilazane with an aluminum compound.

The polysilazane as a material for forming the silica coating has in its molecular chain a silazane structure represented by the following general formula (1):

In the above formula, $R^1$, $R^2$ and $R^3$ each independently represents a hydrogen atom, a hydrocarbon group, a hydrocarbon group-containing silyl group, a hydrocarbon group-containing amino group, or a hydrocarbonoxy group. At least one of $R^1$ and $R^2$ represents a hydrogen atom. The hydrocarbon group may be combined with a substituent, and examples of the substituent include halogen such as chlorine, bromine and fluorine, an alkoxy group, an alkoxycarbonyl group, and an amino group.

The hydrocarbon group includes an aliphatic hydrocarbon group and an aromatic hydrocarbon group, and the aliphatic hydrocarbon group includes a chain hydrocarbon group and a cyclic hydrocarbon group. Examples of the hydrocarbon group include an alkyl group, an alkenyl group, a cycloalkyl group, a cycloalkenyl group, an aryl group, and an arylalkyl group. The number of carbon atoms in these hydrocarbon atoms is not limited, but is usually 20 or less, and preferably 10 or less. In the present invention, preferred is an alkyl group having 1 to 8 carbon atoms, and particularly 1 to 4 carbon atoms. In the hydrocarbon group-containing silyl group, a preferable hydrocarbon group is an alkyl group having 1 to 20 carbon atoms, and particularly 1 to 6 carbon atoms. The number of hydrocarbon atoms to be combined with Si is within a range from 1 to 3. In the hydrocarbon-containing amino group and hydrocarbonoxy group, the number of carbon atoms in the hydrocarbon group is within a range from 1 to 3.

The polysilazane having a silazane structure represented by the general formula (1) in a molecular chain may be a polysilazane having a chain, cyclic or crosslinked structure, or a mixture thereof. The number-average molecular weight is within a range from 100 to 100,000, and preferably from 300 to 10,000. Such a polysilazane includes conventional perhydropolysilazane, organopolysilazane, and a modified compound thereof.

Examples of the modified polysilazane include a platinum- or palladium-containing polysilazane, an alcohol residue-containing polysilazane, an HMDS (hexamethyldisilazane) residue-containing polysilazane, an amine-containing polysilazane, and an organic acid-containing polysilazane.

For example, these modified polysilazanes are described in Japanese Unexamined Patent Publication Nos. 9-31333, 8-176512, 8-176511, and 5-345826.

The aluminum to be incorporated into the polysilazane may be an aluminum compound in the form capable of being dissolved in an organic solvent. Such a soluble aluminum compound includes an alkoxide, a chelete compound, an organoaluminum, and a halide.

Examples of the alkoxide of aluminum include those represented by the following general formula (2):

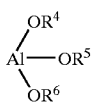

(2)

In the above formula, $R^4$, $R^9$ and $R^6$ represent a hydrocarbon group. The hydrocarbon group includes an aliphatic hydrocarbon group and an aromatic hydrocarbon group. The aliphatic hydrocarbon group includes a chain hydrocarbon group and a cyclic hydrocarbon group. Examples of the aliphatic hydrocarbon group include an alkyl group, an alkenyl group, a cycloalkyl group, and a cycloalkenyl group. The number of carbon atoms is not specifically limited, but is usually 20 or less, and preferably 8 or less. Specific examples of the aliphatic hydrocarbon group include methyl, ethyl, propyl, butyl, pentyl, octyl, dodecyl, octadecyl, dodecenyl, cyclohexyl, and cyclohexenyl. The aromatic hydrocarbon group includes an aryl group and an arylalkyl group. Specific examples of the aromatic hydrocarbon group include phenyl, tolyl, xylyl, naphthyl, benzyl, phenethyl, and naphthylmethyl.

Examples of the chelete compound of aluminum include aluminum acetylacetonate and aluminum ethylacetonate.

Examples of the organoaluminum include those represented by the following general formula (3):

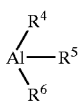

(3)

In the above formula, $R^4$, $R^5$ and $R^6$ represent a hydrocarbon group. The hydrocarbon group includes those described in connection with the general formula (2).

Examples of the halide of aluminum include those represented by the following general formula (4):

 (4)

wherein X represents a halogen. The halogen includes chlorine, bromine, iodine, and fluorine.

The organic solvent-soluble aluminum compounds can be used alone or in combination.

The amount of the aluminum compound to be added to the polysilazane varies depending on the kind, but is within a range from 0.001 to 10% by weight as aluminum, preferably from 0.01 to 10% by weight, and more preferably from 0.1 to 1% by weight, on the basis of the polysilazane. When the amount of the aluminum compound is larger than the range described above, the density and homogeneity of the resulting silica coating are lowered. Therefore, it is not preferred. On the other hand, when the amount is smaller than the range, the effect of the added aluminum compound becomes insufficient.

To obtain the aluminum-containing polysilazane, a polysilazane and an aluminum compound are mixed with stirring in an organic solvent. In this case, they are mixed with stirring under the conditions of a temperature within a range from 0 to 200° C., preferably from 0 to 100° C., and a pressure within a range from normal pressure to 10 kg/cm²G, preferably normal pressure. The concentration of the polysilazane in the organic solvent is within a range from 0.1 to 80% by weight, and preferably from 5 to 50% by weight.

As the organic solvent in which the polysilazane and aluminum compound are dissolved, an inert organic solvent free from active hydrogen is used. Examples of the organic solvent include an aromatic hydrocarbon solvent such as benzene, toluene, xylene, ethylbenzene, diethylbenzene, trimethylbenzene, or triethylbenzene; an alicyclic hydrocarbon solvent such as cyclohexane, cyclohexene, decahydronaphthalene, ethylcyclohexane, methylcyclohexane, p-menthine, or dipentene (limonene); an ether solvent such as dipropyl ether or dibutyl ether; and a ketone solvent such as methyl isobutyl ketone.

An aluminum-containing polysilazane, in which an aluminum compound is mixed or added, is formed by mixing the polysilazane and the aluminum compound with stirring in the organic solvent. Usually, the resulting aluminum-containing polysilazane does not have an aluminopolysilazane structure wherein aluminum and silicon are firmly combined.

The coating composition of the present invention is obtained by adding a polyacrylate or polymethacrylate ester to an organic solvent solution containing the aluminum-containing polysilazane thus obtained.

The polyacrylate or polymethacrylate ester, which is useful in the present invention, is a homopolymer or copolymer of a polyacrylate or polymethacrylate ester, and specific examples thereof include polymethyl acrylate, polyethyl acrylate, polybutyl acrylate, polymethyl methacrylate, polyethyl methacrylate, polybutyl methacrylate, polyisobutyl methacrylate, and block copolymers and other copolymers thereof.

As the polyacrylate or polymethacrylate ester in the present invention, those having a number-average molecular weight within a range from 1,000 to 800,000 are used. When the number-average molecular weight is smaller than 1,000, a porous coating is not formed because the polyacrylate or polymethacrylate ester is sublimated at low temperature. When the number-average molecular weight exceeds 800,000, the pore size increases to cause voids, thus reducing the coating strength. Therefore, both cases are not preferred. The number-average molecular weight of the polyacrylate or polymethacrylate ester in the present invention is preferably within a range from 10,000 to 600,00, and particularly preferred results are obtained when the number-average molecular weight is within a range from 50,000 to 300,000.

The amount of the polyacrylate or polymethacrylate ester in the present invention is controlled within a range from 5 to 150% by weight based on the polysilazane used. When the amount of the polyacrylate or polymethacrylate ester is smaller than 5% by weight, the coating is insufficiently made porous. On the other hand, when the amount is larger than 150% by weight, defects such as voids and cracks occur, thereby to reduce the coating strength. Therefore, it is not preferred. The amount of the polyacrylate or polymethacrylate ester in the present invention is preferably within a range from 10 to 120% by weight, and particularly preferred results are obtained when the amount is within a range from 20 to 100% by weight.

The polyacrylate or polymethacrylate ester is generally added to an aluminum-containing polysilazane solution in the form of a solution prepared by dissolving the polyester in an organic solvent. In this case, the same organic solvent as that used in preparation of the aluminum-containing polysilazane solution may be used as the organic solvent. As the organic solvent in which the polyacrylate or polymethacrylate ester is dissolved, an inert organic solvent free from active hydrogen described above is used. When using the polyacrylate or polymethacrylate ester after dissolving in the organic solvent, the concentration of the polyacrylate or polymethacrylate ester can be controlled within a range from 5 to 80% by weight, and preferably from 10 to 40% by weight. A homogeneous solution can be obtained by physically stirring after the addition of the polyacrylate or polymethacrylate ester.

The polyacrylate or polymethacrylate ester itself can also be added and dissolved in the aluminum-containing polysilazane solution. The coating composition of the present invention can be prepared by combining the polysilazane with the polyacrylate or polymethacrylate ester and mixing the aluminum compound therewith, or combining the polyacrylate or polymethacrylate ester with the aluminum compound and mixing the polysilazane therewith.

The resulting organic solvent solution containing the aluminum-containing polysilazane and the polyacrylate or polymethacrylate ester can be coated on the surface of a substrate by using it as a coating composition with or without controlling the concentration of the polysilazane.

Examples of the method of coating the coating composition containing the aluminum-containing polysilazane and the polyacrylate or polymethacrylate ester to the surface of the substrate include conventionally known methods, for example, spin coating method, dipping method, spraying method, and transferring method.

The aluminum-containing polysilazane coating formed on the surface of the substrate is fired in various atmospheres. The atmosphere includes, for example, an atmosphere which scarcely contains water vapor, such as dry air, dry nitrogen, or dry helium, or an atmosphere containing water vapor, such as atmospheric air, moistened atmospheric air, or moistened nitrogen. The firing temperature is within a range from 50 to 600° C., and preferably from 300 to 500° C., and the firing time is within a range from one minute to one hour.

According to the present invention, a silica coating having a low dielectric constant and a good coating quality is advantageously prepared by forming a polysilazane.coating on the surface of a substrate, preliminary heating the coating in a water vapor-containing atmosphere and firing the coating with heating in a dry atmosphere. In this case, in the water vapor-containing atmosphere, the water vapor content is 0.1 volume % or more, and preferably 1 volume % or more. The upper limit value is the dew point. Examples of such an atmosphere include atmospheric air, moistened atmospheric air, and moistened nitrogen gas. In the dry atmosphere, the water vapor content is 0.5 volume % or less, and preferably 0.05 volume. % or less. Examples of the dry atmosphere include dry air, nitrogen gas, argon gas, and helium gas. The preliminary heating temperature is within a range from 50 to 400° C., and preferably from 100 to 350° C. The firing temperature is within a range from 100 to 500° C., and preferably from 300 to 500° C.

In the firing of the aluminum-containing polysilazane coating, Si—H, Si—R (R: hydrocarbon group) and Si—N bonds in the polysilazane are oxidized and converted into Si—O bonds to form a silica coating. In this case, a Si—OH bond is not substantially formed. Generally, in the firing of the polysilazane coating with heating, Si—H, Si—R and Si—N bonds are oxidized nearly simultaneously, although it varies depending on the conditions of firing. This fact is confirmed from the fact that absorptions based on Si—H, Si—R and Si—N disappear nearly simultaneously when the IR spectrum of the resulting silica coating is measured. According to the present inventors' study, it was confirmed that, in case of the firing of the aluminum-containing polysilazane coating used in the present invention with heating, the oxidation of the Si—N bond, namely, the reaction of substituting N with O preferentially proceeds as compared with the oxidation of the Si—H and Si—R bonds by a catalytic action of aluminum.

Therefore, the present invention allows the Si—O bond formed by selectively oxidizing the Si—N bond, and the unoxidized Si—H and Si—R bonds, to exist in the formed silica coating, thereby making it possible to obtain a silica coating with a low density. Generally, the dielectric constant of the silica coating is reduced with the reduction of the coating density, while adsorption of water as a high dielectric substance occurs when the coating density is reduced. Therefore, there arises a problem that the dielectric constant increases when the silica coating is left to stand in an atmospheric air. In the case of the silica coating containing Si—H and Si—R bonds of the present invention, adsorption of water can be prevented regardless of low density because these bonds have water repellency. Therefore, the silica coating of the present invention has a large merit that the dielectric constant of the coating scarcely increases even if the silica coating is left to stand in an atmospheric air containing water vapor. The silica coating of the present invention also has a merit that it is less likely to cause cracking because the internal stress of the coating is small due to low density.

In the firing of the coating, micropores having a diameter of 0.5 to 30 nm are formed in the silica coating by sublimation of the polyacrylate of polymethacrylate ester in the coating. The existence of the micropores further reduces the density of the silica coating, and thus the dielectric constant of the silica coating is further reduced. This is because the compatibility between the aluminum-containing polysilazane and the polyacrylate of polymethacrylate ester is very good. The use of the polyacrylate of polymethacrylate ester prevents the Si—OH bond from forming in the polysilazane during the firing of the coating. Therefore, the silica coating maintains the water repellency and the dielectric constant reduced due to the micropores scarcely increases even when left to stand in an atmospheric air containing water vapor. As described above, according to the present invention, it is made possible to obtain a porous silica coating capable of stably maintaining a very low dielectric constant of less than 2.5, preferably 2.0 or less, occasionally about 1.6, in cooperation with the reduction in density and impartation of water repellency due to the bond component (SiH, SiR) of the silica coating as well as reduction in density of the whole coating due to micropores. Therefore, since a water repellent treatment required to prevent moisture absorption in a conventional porous silica coating is not required, it becomes advantageous in view of the manufacturing cost and an inorganic material's merit is not impaired by introduction of an organic group.

Referring to other properties of the silica coating of the present invention, the density is within a range from 0.5 to 1.4 g/cm$^3$, and preferably from 0.7 to 1.1 g/cm$^3$, and the cracking limitation in coating thickness is 1.0 μm or more, and preferably 10 μm or more and, furthermore, the internal stress is 2.0×10$^4$ N/cm$^2$ or less, and preferably 1.0×10$^4$ N/cm$^2$ or less. The content of Si, which exists in the form of a Si—H or Si—R bond (R: hydrocarbon group), in the silica coating is within a range from 10 to 100 atomic %, and preferably from 25 to 75 atomic %, based on the number of Si atoms contained in the silica porous coating. The content of Si, which exists in the form of a Si—N bond, is 5 atomic % or less.

The thickness of the silica coating obtained after firing varies depending on the purposes of the substrate surface, but is usually within a range from 0.01 to 5 μm, and preferably from 0.1 to 2 μm. When using as an interlayer dielectric, the thickness is within a range from 0.1 to 2 μm.

In the present invention, when using perhydropolysilazane having no hydrocarbon group as the polysilazane, it is made possible to obtain an inorganic coating with a low dielectric constant, which is composed only of elements of Si, O and H and has a Si—H bond but substantially has neither an N—H bond nor a Si—OH bond. Since this coating is superior in resistance to plasma, a so-called etch-back process of removing a coating layer on the metal wiring in a process of manufacturing a semiconductor can be omitted by applying this coating in the manufacture of the semiconductor. Therefore, the process of manufacturing the semiconductor can be markedly simplified.

As described above, the porous silica coating of the present invention has a low density and has a merit that a cracking limitation in coating thickness, namely, a maximum coating thickness where a coating can be formed without causing cracking of the coating is 5 μm or more. In case of a conventional silica coating, the cracking limitation in coating thickness is within a range from about 0.5 to 1.5 μm. Therefore, the silica coating of the present invention exhibits a large technical effect as compared with a conventional silica coating.

The method of forming the silica coating of the present invention can be carried out very easily because the aluminum-containing polysilazane, as a precursor thereof, can be converted into a silica coating at a firing temperature lower than 450° C. even in a dry atmospheric air by a catalytic action of aluminum.

Therefore, the present invention is advantageously applied as a method of forming an insulating coating to an aluminum wiring whose heat-resistant upper limit temperature is 450° C. According to the present invention, since the content of the Si—N bond can be substantially reduced to 0% by a catalytic action of aluminum, the coating has very high stability and is not deteriorated even when left to stand in atmospheric air.

The silica coating of the present invention can be advantageously used as an interlayer dielectric in a, semiconductor device. In this case, the silica coating is formed on the plane including a metal wiring, or a metal wiring with a ceramic coating. The semiconductor device including the silica coating of the present invention is not only superior in insulating properties, but also in electric characteristics because of small dielectric constant.

A silica coating can be formed on the solid surface of various materials such as metal, ceramics or lumber by using the coating composition of the present invention. According to the present invention, there are provided a metal substrate (silicon, stainless steel (SUS), tungsten, iron, copper, zinc, brass, or aluminum) with a silica coating formed thereon, and a ceramics substrate (metal oxide such as silica, alumina, magnesium oxide, titanium oxide, zinc oxide and tantalum oxide, metal nitride such as silicon nitride, boron nitride and titanium nitride, or silicon carbide) with a silica coating formed thereon.

The following Examples further illustrate the present invention in detail.

The method of evaluating physical properties of the silica coating is as follows.

Dielectric Constant

A Pyrex glass plate (thickness: 1 mm, size: 50 mm×50 mm) manufactured by Dow Corning Inc. was sufficiently washed, in order, with a neutral detergent, an aqueous diluted NaOH solution and an aqueous diluted H$_2$SO$_4$ solution, and then dried. An Al coating (0.2 μ) was formed on the whole surface of the glass plate by a vacuum deposition method. After coating the glass plate with a polysilazane solution by a spin coating method, the resulting polysilazane coating (about 3 mm×3 mm in size) was removed by rubbing, with a rod applicator, four corners of the glass plate to form portions for taking electric signals. Subsequently, the polysilazane coating was converted into a silica coating in accordance with the method of the Examples or Comparative Examples. The resulting silica coating was covered with a mask of SUS and an Al coating was formed by a vacuum deposition method (18 patterns in the form of square of 2 mm×2 mm, 2 μm in thickness). A capacitance was measured by an impedance analyzer 4192 ALF manufactured by YHP Inc. (100 kHz). The thickness of the coating was measured by a profilometer (Dektak IIA manufactured by Sloan Inc.). The dielectric constant was calculated by the following equation.

Dielectric constant=(Capacitance [pF])×(Coating thickness [μm])/35.4

The dielectric constant was determined by calculating an average of 18 measured values.

Coating Density

The weight of a silicon wafer, 4 inch in diameter and 0.5 mm in thickness, was measured by an electric balance. After coating the silicon wafer with a polysilazane solution by a spin coating method, the resulting polysilazane coating was converted into a silica coating in accordance with the method of the Examples or Comparative Examples and the weight of the coated silicon wafer was measured again by the electric balance. A difference in weight was taken as the weight of the coating. In the same manner as in case of the evaluation of the dielectric constant, the thickness of the coating was measured by a profilometer (Dektak IIA manufactured by Sloan Inc.). The coating density was calculated by the following equation.

Coating density [g/cm$^3$]=(Coating weight [g])×(Coating thickness [μm])/0.008.

Internal Stress

Data of warp of a silicon wafer, 4 inch in diameter and 0.5 mm in thickness, were input in a laser thin film internal stress measurement system Model FLX-2320 manufactured by Tencor Corporation. After coating the silicon wafer with a polysilazane solution by a spin coating method, the resulting polysilazane coating was converted into a silica coating in accordance with the method of the Examples or Comparative Examples and cooled to room temperature (23° C.). Then, the internal stress was measured by the laser thin film internal stress measurement system Model FLX-2320 manufactured by Tencor Corporation. In the same manner as in case of the evaluation of the dielectric constant, the thickness of the coating was measured by a profilometer (Dektak IIA manufactured by Sloan Inc.).

Cracking Limitation in Coating Thickness

After coating a silicon wafer, 4 inch in diameter and 0.5 mm in thickness, with a polysilazane solution by a spin coating method, the resulting polysilazane coating was converted into a silica coating in accordance with the method of the Examples or Comparative Examples. Samples having coating different thicknesses within a range from about 0.5 to 3μ were made by controlling the polysilazane concentration of the polysilazane solution or the rotational speed of a spin coater. The fired thin coating was observed by a microscope (magnification: ×120) and it was examined whether or not cracking occurred. A maximum coating thickness where no cracking occurs was taken as a cracking limitation in coating thickness.

REFERENCE EXAMPLE

Synthesis of Perhydropolysilazane

A four-necked flask having an internal volume of 2 L was equipped with a gas bubbling tube, a mechanical scaler and a Dewar condenser. After replacing the atmosphere of a reaction vessel by dry nitrogen, 1500 ml of dry pyridine was charged in the four-necked flask and then ice-cooled. 100 g of dichlorosilane was added to produce an adduct as a white solid ($SiH_2Cl_2$ $2C_5H_5N$). The reaction mixture was ice-cooled and 70 g of ammonia was bubbled into the reaction mixture while stirring. Subsequently, dry nitrogen was bubbled into the aqueous layer for 30 minutes to remove excess ammonia.

The resulting product was removed by filtering through a Buchner funnel under reduced pressure in a dry nitrogen atmosphere to obtain 1200 ml of a filtrate. Pyridine was distilled off by an evaporator to obtain 40 g of perhydropolysilazane.

The number-average molecular weight of the resulting perhydropolysilazane was measured by GPC (developing solution: $CDCl_3$). As a result, it was 800 calibrated with polystyrene standards. An IR (infrared absorption) spectrum showed absorptions based on N—H at a wave number of approximately 3350 and 1200 $cm^{-1}$, an absorption based on Si—H at 2170 $cm^{-1}$, and an absorption based on Si—N—Si at 1020 to 820 $cm^{-1}$.

COMPARATIVE EXAMPLE 1

20 g of perhydropolysilazane synthesized in Reference Example 1 was dissolved in 80 g of xylene to prepare a polysilazane solution. Subsequently, the polysilazane solution was filtered through a PTFE syringe filter having a filtration accuracy of 0.2 μm manufactured by Advantech Co., Ltd. The filtered polysilazane solution was coated on a silicon wafer of 4 inch in diameter and 0.5 mm in thickness using a spin coater (1500 rpm, 20 seconds), and then dried at room temperature (10 minutes). The silicon plate coated with polysilazane was heated on a hot plate at 100° C., then at 200° C. in an atmospheric air (25° C., relative humidity: 40%) each for 3 minutes. The heated silicon plate was fired in a dry nitrogen atmosphere at 400° C. for one hour. Absorptions based on Si—O at a wave number of 1020 and 450 $cm^{-1}$ was observed. Absorptions of unconverted polysilazane, namely, absorptions based on N—H at a wave number of 3380 and 1200 $cm^{-1}$ and absorptions based on Si—H at a wave number of 2210 and 860 $cm^{-1}$ were observed. The resulting coating was evaluated. As a result, the coating had a dielectric constant of 4.2, a density of 1.8 $g/cm^3$, an internal stress of $1.2 \times 10^4$ $N/cm^2$, and a cracking limitation in coating thickness of 2.2 μm. The resulting coating was left to stand in an atmospheric air under the conditions of a temperature of 23° C. and a relative humidity of 50% for a week and the dielectric constant was measured again. As a result, it was 4.8.

COMPARATIVE EXAMPLE 2

25 g of perhydropolysilazane synthesized in Reference Example 1 was dissolved in 55 g of xylene to prepare a polysilazane solution. Subsequently, 0.1 g of tri(isopropoxy) aluminum was mixed with 20 g of xylene and sufficiently dissolved. The resulting solution was mixed with the polysilazane solution. The mixed solution was filtered through a PTFE syringe filter having a filtration accuracy of 0.2 μm manufactured by Advantech Co., Ltd. The filtered solution was coated on a silicon wafer, 4 inch in diameter and 0.5 mm in thickness, using a spin coater (1500 rpm, 20 seconds), and then dried at room temperature (10 minutes). The silicon plate coated with polysilazane was heated on a hot plate at 100° C., then at 200° C. in an atmospheric air (250° C., relative humidity: 40%) for each 3 minutes. The heated silicon plate was fired in a dry nitrogen atmosphere at 400° C. for one hour. Absorptions based on Si—O at a wave number of 1070 and 450 $cm^{-1}$ and absorptions based on Si—H at a wave number of 2250 and 880 $cm^{-1}$ were mainly observed, while absorptions based on N—H at a wave number of 3350 and 1200 $cm^{-1}$ nearly disappeared. The resulting coating was evaluated. As a result, the coating had a dielectric constant of 3.0, a density of 2.9 $g/cm^3$, an internal stress of $1.2 \times 10^4$ $N/cm^2$, and a cracking limitation in coating thickness of 1.4 μm. The resulting coating was left to stand in an atmospheric air under the conditions of a temperature of 23° C. and a relative humidity of 50% for a week and the dielectric constant was measured again. As a result, it was 3.2.

COMPARATIVE EXAMPLE 3

25 g of perhydropolysilazane synthesized in Reference Example 1 was dissolved in 55 g of xylene to prepare a polysilazane solution. Subsequently, 0.1 g of tri (ethylacetoacetate)aluminum was mixed with 20 g of xylene and sufficiently dissolved. The resulting solution was mixed with the polysilazane solution. The mixed solution was filtered through a PTFE syringe filter having a filtration accuracy of 0.2 μm manufactured by Advantech Co., Ltd. The filtered solution was coated on a silicon wafer, 4 inch in diameter and 0.5 mm in thickness, using a spin coater (1500 rpm, 20 seconds), and then dried at room temperature (10 minutes). The silicon plate coated with polysilazane was heated on a hot plate at 150° C., then at 220° C. in an atmospheric air (25° C., relative humidity: 40%) each for 3 minutes. The heated silicon plate was fired in a dry nitrogen atmosphere at 400° C. for one hour. Absorptions based on Si—O at a wave number of 1065 and 460 $cm^{-1}$ and absorptions based on Si—H at a wave number of 2250 and 830 $cm^{-1}$ were mainly observed, while absorptions based on N-H at a wave number of 3350 and 1200 $cm^{-1}$ nearly disappeared. The resulting coating was evaluated. As a result, the coating had a dielectric constant of 2.3, a density of 1.7 $g/cm^3$, an internal stress of $1.2 \times 10^4$ $N/cm^2$, and a cracking limitation in coating thickness of 1.3 μm. The resulting coating was left to stand in an atmospheric air under the conditions of a temperature of 23° C. and a relative humidity of 50% for a week and the dielectric constant was measured again. As a result, it was 2.5.

EXAMPLE 1

30 g of perhydropolysilazane synthesized in Reference Example 1 was dissolved in 120 g of xylene to prepare a polysilazane solution. Subsequently, 3 g of tri(acetylacetonato)aluminum was mixed with 97 g of xylene and sufficiently dissolved. 1 g of the solution from the resulting solution was mixed with the polysilazane solution. A solution prepared by sufficiently dissolving 15 g of polymethyl methacrylate having a molecular weight of about 95,000 in 60 g of xylene was mixed with the polysilazane solution, followed by stirring sufficiently. The mixed solution was filtered through a PTFE syringe filter having a filtration accuracy of 0.2 μm manufactured by Advantech Co., Ltd. The filtered solution was coated on a silicon wafer of 4 inch in diameter and 0.5 mm in thickness using a spin coater (2000 rpm, 20 seconds), and then dried at room temperature (5 minutes). The silicon plate coated with polysilazane was heated on a hot plate at 150° C., then at 220° C. in an atmospheric air (25° C., relative humidity: 40%) for each 3 minutes. The heated silicon plate was fired in a dry nitrogen atmosphere at 400° C. for 30 minutes. Absorptions based on Si—O at a wave number of 1060 and 450 $cm^{-1}$ and absorptions based on Si—H at a wave number of 2250 and 880 $cm^{-1}$ were mainly observed, while absorptions based on N-H at a wave number of 3350 and 1200 $cm^{-1}$ and absorption based on polymethyl methacrylate disappeared. The resulting coating was evaluated. As a result, the coating had a dielectric constant of 1.9, a density of 0.8 g/$cm^3$, an internal stress of 2.6×$10^3$ N/$cm^2$, and a cracking limitation in coating thickness of 5 μm or more. The resulting coating was left to stand in an atmospheric air under the conditions of a temperature of 23° C. and a relative humidity of 50% for a week and the dielectric constant was measured again. As a result, it was 2.0.

EXAMPLE 2

30 g of perhydropolysilazane synthesized in Reference Example 1 was dissolved in 120 g of dibutyl ether to prepare a polysilazane solution. Subsequently, 3 g of aluminumtris (ethyl acetoacetate) was mixed with 97 g of dibutyl ether and sufficiently dissolved. 2 g of the solution from the resulting solution was mixed with the polysilazane solution. A solution prepared by sufficiently dissolving 15 g of poly (isobutyl) methacrylate having a molecular weight of about 180,000 in 60 g of dibutyl ether was mixed with the polysilazane solution, followed by stirring sufficiently. The mixed solution was filtered through a PTFE syringe filter having a filtration accuracy of 0.2 μm manufactured by Advantech Co., Ltd. The filtered solution was coated on a silicon wafer, 4 inch in diameter and 0.5 mm in thickness, using a spin coater (2000 rpm, 20 seconds), and then dried at room temperature (5 minutes). The silicon plate coated with polysilazane was heated on a hot plate at 150° C., then at 220° C. in an atmospheric air (25° C., relative humidity: 40%) for each 3 minutes. The heated silicon plate was fired in a dry nitrogen atmosphere at 400° C. for 30 minutes. Absorptions based on Si—O at a wave number of 1070 and 455 $cm^{-1}$ and absorptions based on Si—H at a wave number of 2300 and 850 $cm^{-1}$ were mainly observed, while absorptions based on N—H at a wave number of 3350 and 1200 $cm^{-1}$ and absorption based on poly(isobutyl) methacrylate disappeared. The resulting coating was evaluated. As a result, the coating had a dielectric constant of 2.0, a density of 1.0 g/$cm^3$, an internal stress of 3.1×$10^3$ N/$cm^2$, and a cracking limitation in coating thickness of 5 μm or more. The resulting coating was left to stand in an atmospheric air under the conditions of a temperature of 23° C. and a relative humidity of 50% for a week and the dielectric constant was measured again. As a result, it was 2.1.

EXAMPLE 3

20 g of perhydropolysilazane synthesized in Reference Example 1 was dissolved in 80 g of xylene to prepare a polysilazane solution. Subsequently, 2 g of tri (ethylacetoacetate)aluminum was mixed with 98 g of xylene and sufficiently dissolved. 1 g of the solution from the resulting solution was mixed with the polysilazane solution. A solution prepared by sufficiently dissolving 20 g of BR80 manufactured by Mitsubishi Rayon Co., Ltd. in 80 g of xylene was mixed with the polysilazane solution, followed by stirring sufficiently. The mixed solution was filtered through a PTFE syringe filter having a filtration accuracy of 0.2 μm manufactured by Advantech Co., Ltd. The filtered solution was coated on a silicon wafer, 4 inch in diameter and 0.5 mm in thickness, using a spin coater (2000 rpm, 20 seconds), and then dried at room temperature (5 minutes). The silicon plate coated with polysilazane was heated on a hot plate at 150° C., then at 220° C. in an atmospheric air (25° C., relative humidity: 40%) for each 3 minutes. The heated silicon plate was fired in a dry nitrogen atmosphere at 400° C. for 30 minutes. Absorptions based on Si—O at a wave number of 1075 and 470 $cm^{-1}$ and absorptions based on Si—H at a wave number of 2250 and 840 $cm^{-1}$ were mainly observed, while absorptions based on N—H at a wave number of 3350 and 1200 $cm^{-1}$ and absorption based on BR80 disappeared. The resulting coating was evaluated. As a result, the coating had a dielectric constant of 1.6, a density of 0.8 g/$cm^3$, an internal stress of 1.8×$10^3$ N/$cm^2$, and a cracking limitation in coating thickness of 5 μm or more. The resulting coating was left to stand in an atmospheric air under the conditions of a temperature of 23° C. and a relative humidity of 50% for a week and the dielectric constant was measured again. As a result, it was 1.6.

EXAMPLE 4

20 g of perhydropolysilazane synthesized in Reference Example 1 was dissolved in 80 g of dibutyl ether to prepare a polysilazane solution. Subsequently, 2 g of aluminumtris (ethylacetoacetate) was mixed with 98 g of dibutyl ether and sufficiently dissolved. 2 g of the solution from the resulting solution was mixed with the polysilazane solution. A solution prepared by sufficiently dissolving 10 g of BR1122 manufactured by Mitsubishi Rayon Co., Ltd. in 40 g of dibutyl ether was mixed with the polysilazane solution, followed by stirring sufficiently. The mixed solution was filtered through a PTFE syringe filter having a filtration accuracy of 0.2 μm manufactured by Advantech Co., Ltd. The filtered solution was coated on a silicon wafer, 4 inch in diameter and 0.5 mm in thickness, using a spin coater (2000 rpm, 20 seconds), and then dried at room temperature (5 minutes). The silicon plate coated with polysilazane was heated on a hot plate at 150° C., 220° C., then at 300° C in an atmospheric air (25° C., relative humidity: 40%) for each 3 minutes. The heated silicon plate was fired in a dry nitrogen atmosphere at 400° C. for 30 minutes. Absorptions based on Si—O at a wave number of 1068 and 435 $cm^{-1}$ and absorptions based on Si—H at a wave number of 2300 and 830 $cm^{-1}$ were mainly observed, while absorptions based on N—H at a wave number of 3350 and 1200 $cm^{-1}$ and absorption based on BR1122 disappeared. The resulting coating was evaluated. As a result, the coating had a dielectric constant of 1.9, a density of 0.9 g/$cm^3$, an internal stress of 2.8×$10^3$ N/$cm^2$, and a cracking limitation in coating thickness of 5 μm or more. The resulting coating was left to stand in an atmospheric air under the conditions of a temperature of 23° C. and a relative humidity of 50% for a week-and the dielectric constant was measured again. As a result, it was 2.0.

EXAMPLE 5

40 g of perhydropolysilazane synthesized in Reference Example 1 was dissolved in 160 g of xylene to prepare a polysilazane solution. Subsequently, 2 g of tri(isopropoxy) aluminum was mixed with 98 g of xylene and sufficiently dissolved. 6 g of the solution from the resulting solution was mixed with the polysilazane solution. A solution prepared by sufficiently dissolving 10 g of BR80 manufactured by Mitsubishi Rayon Co., Ltd. in 40 g of xylene was mixed with the polysilazane solution, followed by stirring sufficiently. The mixed solution was filtered through a PTFE syringe filter having a filtration accuracy of 0.2 μm manufactured by Advantech Co., Ltd. The filtered solution was coated on a silicon wafer, 4 inch in diameter and 0.5 mm in thickness, using a spin coater (2000 rpm, 20 seconds), and then dried at room temperature (5 minutes). The silicon plate coated with polysilazane was heated on a hot plate at 150° C., then at 220° C. in an atmospheric air (25° C, relative humidity: 40%) for each 3 minutes. The heated silicon plate was fired in a dry nitrogen atmosphere at 400° C. for 30 minutes. Absorptions based on Si—O at a wave number of 1070 and 450 cm$^{-1}$ and absorptions based on Si—H at a wave number of 2250 and 880 cm$^{-1}$ were mainly observed, while absorptions based on N—H at a wave number of 3350 and 1200 cm$^{-1}$ and absorption based on BR80 disappeared. The resulting coating was evaluated. As a result, the coating had a dielectric constant of 1.8, a density of 1.0 g/cm$^3$, an internal stress of 2.7×10$^3$ N/cm$^2$, and a cracking limitation in coating thickness of 5 μm or more. The resulting coating was left to stand in an atmospheric air under the conditions of a temperature of 23° C. and a relative humidity of 50% for a week and the dielectric constant was measured again. As a result, it was 2.0.

INDUSTRIAL APPLICABILITY

The porous silica coating of the present invention has a low density and a low dielectric constant of less than 2.5, in addition to the chemical resistance, gas/ion barrier properties, wear resistance, heat resistance and flattening properties which are inherent in a silica coating derived from a polysilazane. This porous silica coating scarcely adsorbs water vapor even when left to stand in an atmospheric air because it contains a hydrophobic Si—H bond and, therefore, the dielectric constant is less likely to increase. Moreover, the porous silica coating of the present invention has a feature that it has small coating stress and high coating thickness limitation. Accordingly, the porous silica coating of the present invention is suited for use as an interlayer dielectric in semiconductors.

The porous silica coating of the present invention is preferably used as the interlayer dielectric in semiconductors, and is also advantageously used as an insulating coating in the electrical and electronic fields, such as under coating (insulating flattened coating) of liquid crystal glass and gas barrier coating of film liquid crystal.

The method of forming a porous silica coating of the present invention can be applied as, for example, a hard coating onto the surface of a solid such as metal, glass, plastic or lumber, heat-resistant coating, acid-resistant coating, stainproof coating, and water repellent coating. It can also be applied as gas barrier coating onto a plastic film, UV cut coating onto a glass, plastic or lumber, and a coloring coating.

The coating composition can be applied as UV cut coating, coloring coating and antibacterial coating because various functional fillers can be added.

The porous silica coating of the present invention is advantageous in view of the manufacturing cost because it is not required to be subjected to a water repellent treatment for prevention of moisture absorption and, moreover, an inorganic material's merit is not impaired by the introduction of the organic group.

What is claimed is:

1. A method of producing a porous silica coating having a dielectric constant of less than 2.5, characterized by firing a coating of a composition comprising an aluminum-containing polysilazane and either polyacrylate ester or polymethacrylate ester.

2. The method according to claim 1, wherein the porous silica coating maintains the dielectric constant of less than 2.5 even after being left to stand in an atmospheric air at a temperature of 23° C. and a relative humidity of 50% for a week.

3. The method according to claim 1, wherein the dielectric constant 2.1 or less.

4. The method according to claim 1, wherein the porous silica coating has a pore diameter within a range from 0.5 to 30 nm.

5. The method according to claim 1, wherein the polysilazane in the aluminum-containing polysilazane has a silazane structure represented by the following general formula:

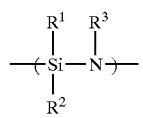

wherein R$^1$, R$^2$ and R$^3$ each independently represents a hydrogen atom, a hydrocarbon group, a hydrocarbon group-containing silyl group, a hydrocarbon group-containing amino group, or a hydrocarbonoxy group, provided that at least one of R$^1$ and R$^2$ represents a hydrogen atom.

6. The method according to claim 5, wherein the porous silica coating has a content of Si, which exists in the form of a Si—R$^1$ or Si—R$^2$ bond, is within a range from approximately 10 to approximately 100 atomic % based on the number of Si atoms contained in the silica porous coating.

7. The method according to claim 6, wherein all of R$^1$, R$^2$ and R$^3$ are hydrogen atoms.

8. The method according to claim 2, wherein the dielectric constant is 2.1 or less.

* * * * *